(12) United States Patent
Miyachi et al.

(10) Patent No.: US 11,437,305 B2
(45) Date of Patent: Sep. 6, 2022

(54) SEMICONDUCTOR MODULE

(71) Applicant: DENSO CORPORATION, Kariya (JP)

(72) Inventors: Shuhei Miyachi, Kariya (JP);
Takaharu Kozawa, Kariya (JP);
Toshihiro Fujita, Kariya (JP)

(73) Assignee: DENSO CORPORATION, Kariya (JP)

( * ) Notice: Subject to any disclaimer, the term of this patent is extended or adjusted under 35 U.S.C. 154(b) by 121 days.

(21) Appl. No.: 16/882,990

(22) Filed: May 26, 2020

(65) Prior Publication Data
US 2020/0381343 A1    Dec. 3, 2020

(30) Foreign Application Priority Data

May 30, 2019   (JP) .............................. JP2019-101765

(51) Int. Cl.
| | |
|---|---|
| *H01L 23/495* | (2006.01) |
| *H01L 23/13* | (2006.01) |
| *H01L 23/52* | (2006.01) |
| *H01L 25/065* | (2006.01) |
| *H01L 25/18* | (2006.01) |
| *H01L 29/78* | (2006.01) |
| *H01L 29/739* | (2006.01) |
| *H02M 7/5387* | (2007.01) |
| *H01L 23/00* | (2006.01) |

(52) U.S. Cl.
CPC ........ *H01L 23/49575* (2013.01); *H01L 23/13* (2013.01); *H01L 23/49562* (2013.01); *H01L 23/52* (2013.01); *H01L 24/48* (2013.01); *H01L 25/0655* (2013.01); *H02M 7/53871* (2013.01); *H01L 2224/48137* (2013.01); *H01L 2924/13055* (2013.01); *H01L 2924/13091* (2013.01)

(58) Field of Classification Search
CPC ........................ H01L 23/49575; H01L 23/13
See application file for complete search history.

(56) References Cited

U.S. PATENT DOCUMENTS

| | | | |
|---|---|---|---|
| 2013/0075884 A1 | 3/2013 | Gong et al. | |
| 2015/0060940 A1* | 3/2015 | Muto | ..................... H01L 25/072 257/140 |
| 2017/0077068 A1* | 3/2017 | Horio | ................... H01L 23/3121 |
| 2017/0236774 A1 | 8/2017 | Fushie et al. | |
| 2017/0338201 A1* | 11/2017 | Shimakawa | ...... H01L 23/49575 |
| 2021/0359677 A1* | 11/2021 | Miura | ................. H01L 29/7397 |

* cited by examiner

*Primary Examiner* — Omar F Mojaddedi
(74) *Attorney, Agent, or Firm* — Maschoff Brennan

(57) ABSTRACT

A semiconductor module includes: semiconductor devices; a resin mold that integrally seals the semiconductor devices; and external terminals that are disposed at a lateral side of the resin mold along a direction perpendicular to a thickness direction of the semiconductor devices. Each semiconductor device includes an insulated gate semiconductor device having a gate electrode, a first electrode, and a second electrode. In the insulated gate semiconductor device, carriers move from the first electrode to the second electrode through a channel provided by a voltage applied to the gate electrode. The external terminals include: a gate terminal electrically connected to the gate electrode; a first terminal electrically connected to the first electrode; and a second terminal electrically connected to the second electrode. The gate terminal and the second terminal, which are electrically connected to an identical semiconductor device, are not adjacent to each other.

12 Claims, 12 Drawing Sheets

SEMICONDUCTOR MODULE

CROSS REFERENCE TO RELATED APPLICATIONS

This application is based on Japanese Patent Application No. 2019-101765 filed on May 30, 2019, the disclosure of which is incorporated herein by reference.

TECHNICAL FIELD

The present disclosure relates to a semiconductor module.

BACKGROUND

In a semiconductor module, multiple semiconductor devices are integrally accommodated in a resin mold. A gate electrode, a drain electrode, and a source electrode of the semiconductor device are electrically connected to a gate terminal, a drain terminal, and a source terminal extending laterally of the resin mold, respectively.

SUMMARY

The present disclosure describes a semiconductor module having multiple semiconductor elements, resin mold and external terminals. The external terminals include a gate terminal, first terminal and a second terminal. The gate terminal and the second terminal, which are electrically connected to an identical semiconductor device among multiple semiconductor devices, are not adjacent to each other.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figures 1A, 1B:
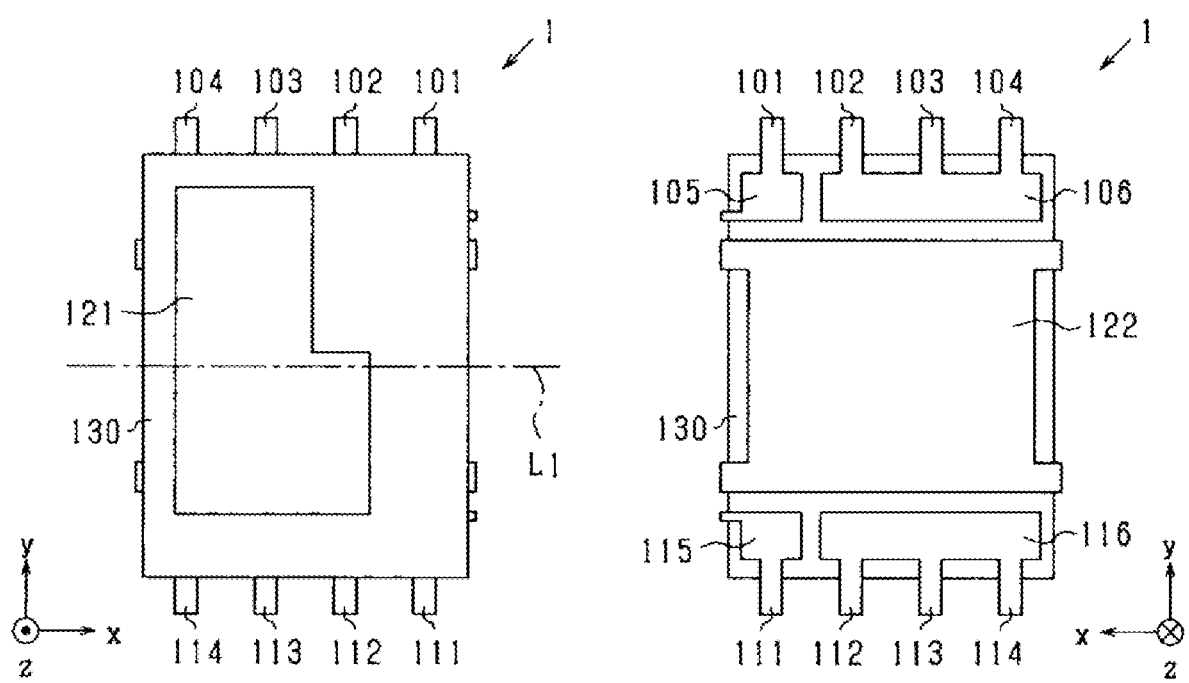
FIG. 1A is a plan view showing a semiconductor module according to a first embodiment.
FIG. 1B is a plan view showing a semiconductor module according to the first embodiment.

In a semiconductor module, a gate terminal, a drain terminal, and a source terminal may be disposed in this stated order. Since the gate terminal and the drain terminal are adjacent to each other, the gate terminal and the drain terminal may be in contact with each other. When the gate terminal and the drain terminal are in contact with each other, a large current called a through current flows through the semiconductor device, and the semiconductor device may have thermal breakdown caused by a heat generation.

In one or more embodiments of the present disclosure, even when adjacent external terminals are in contact with each other in a semiconductor module including multiple semiconductor devices, it is possible to inhibit the thermal breakdown of a semiconductor device.

According to an aspect of the present disclosure, a semiconductor module includes: semiconductor devices; a resin mold that integrally seals the semiconductor devices; and external terminals that are disposed at a lateral side of the resin mold along a direction perpendicular to a thickness direction of the semiconductor devices. The thickness direction is defined as a vertical direction. Each semiconductor device includes an insulated gate semiconductor device having a gate electrode, a first electrode, and a second electrode. In the insulated gate semiconductor device, carriers move from the first electrode to the second electrode through a channel provided by a voltage applied to the gate electrode. The external terminals include: a gate terminal electrically connected to the gate electrode; a first terminal electrically connected to the first electrode; and a second terminal electrically connected to the second electrode. The gate terminal and the second terminal, which are electrically connected to an identical semiconductor device among the semiconductor devices, are not adjacent to each other.

According to the aspect of the present disclosure, the semiconductor device is an insulated gate semiconductor device including a gate electrode, a first electrode, and a second electrode. In the semiconductor device, carriers move from the first electrode side to the second electrode side through a channel provided by applying a voltage to the gate electrode. In the above semiconductor device, when the gate electrode and the second electrode are short-circuited, a through current flows through the semiconductor device. When the gate electrode and the first electrode are short-circuited or when the first electrode and the second electrode are short-circuited, a large current does not flow through the semiconductor device. When the gate terminal and the second terminal electrically connected to an identical semiconductor device are prevented from being adjacent to each other, even if adjacent external terminals are in contact with each other, it is possible to inhibit the thermal breakdown of the semiconductor device.

First Embodiment

As shown in FIGS. 1A to 4, a semiconductor module 1 according to a first embodiment includes a first semiconductor device 10, a second semiconductor device 20, a resin mold 130, and external terminals 101 to 104, 111 to 114. The resin mold 130 integrally seals the first semiconductor device 10 and the second semiconductor device 20. An x-axis direction and a y-axis direction shown in FIGS. 1A to 4 are lateral sides of the semiconductor module 1, and an xy-plane direction is a plane direction of the semiconductor module 1. The z-axis direction is a vertical direction orthogonal to the plane direction.

As shown in FIG. 1A and FIG. 1B, the semiconductor module 1 has an appearance in which eight external terminals 101 to 104 and 111 to 114 protrude in the y-axis direction from the resin mold 130 having a substantially rectangular shape when viewed from the top. The external terminals 101 to 104 are placed in this stated order from a positive direction to a negative direction of the x-axis in a positive direction of the y-axis, which is the lateral side of the resin mold 130, and extend in the y-axis direction as a longitudinal direction. The positive direction of the y-axis may be referred to as a first direction. In other words, the external terminals 101 to 104 are disposed at a first side of the resin mold 130 facing the first direction, and the first side of the resin mold 130 is along the x-axis. The external terminals 111 to 114 are disposed in this stated order from a positive direction to a negative direction of the x-axis in a negative direction of the y-axis, which is opposed to the first direction across the resin mold 130, and extend in the y-axis direction as the longitudinal direction. The negative direction of the y-axis may be referred to as a second direction. In other words, the external terminals 111 to 114 are disposed at a second side of the resin mold 130 facing the second direction, and the second side of the resin mold 130 is along the x-axis. The first and second lateral sides are opposed to each other with the resin mold 130 interposed between the first and second lateral sides.

Figure 2:
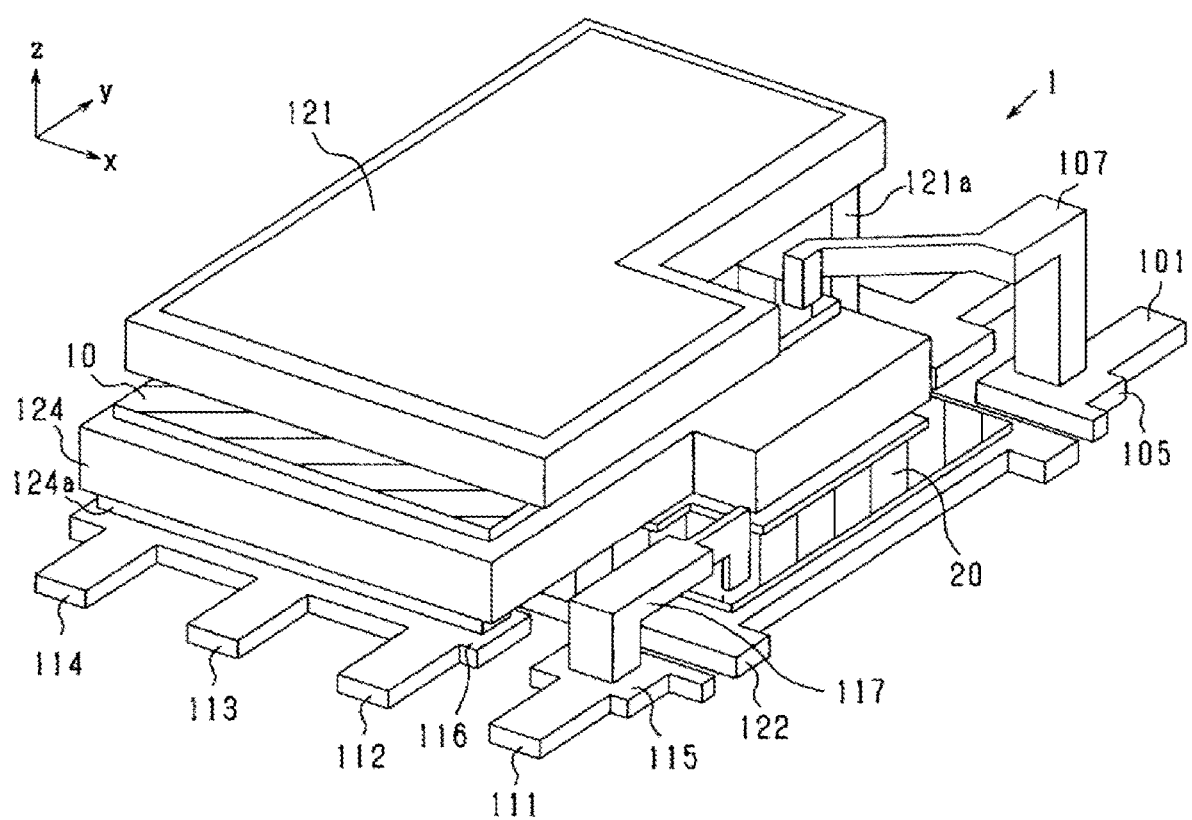
FIG. 2 is a perspective view showing a state in which a resin mold is removed in the semiconductor module shown in FIGS. 1A, 1B.
Figure 3:
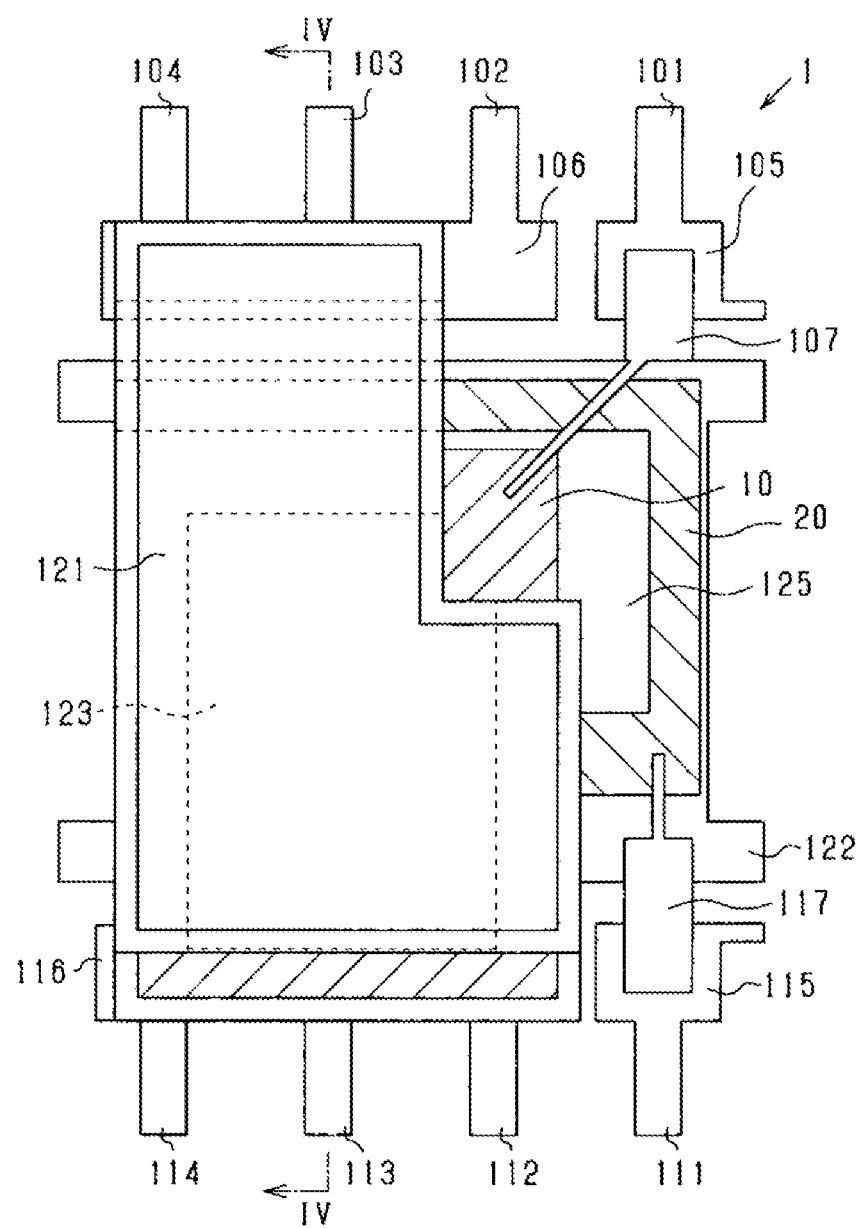
FIG. 3 is a plan view showing a state in which the resin mold is removed in the semiconductor module shown in FIGS. 1A, 1B.
Figure 4:
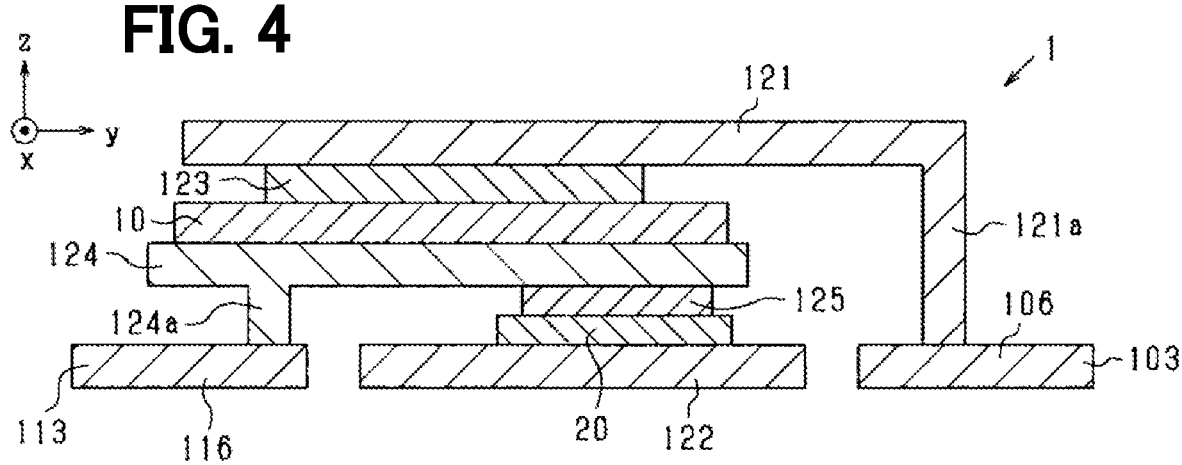
FIG. 4 is a cross-sectional view taken along a line IV-IV of FIG. 3.

As shown in FIGS. 2 to 4, the first semiconductor device 10 and the second semiconductor device 20 are integrally sealed in the resin mold 130 in a state of being stacked on each other in the z-axis direction. The first semiconductor device 10 and the second semiconductor device 20 are semiconductor devices having the same structure, shape, size, and the like, and have a substantially rectangular shape when viewed from the top.

Figure 5:
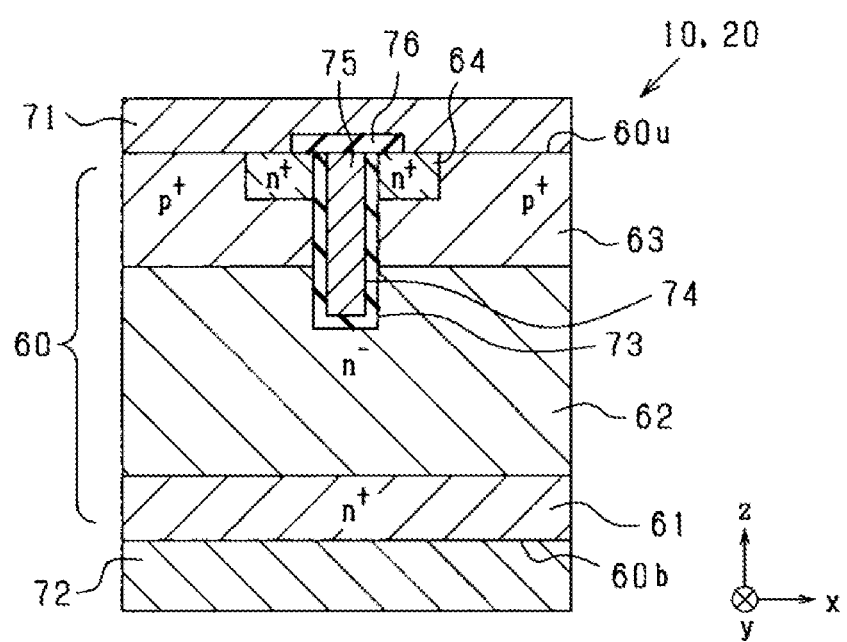
FIG. 5 is a cross-sectional view showing an element structure of a semiconductor device in the semiconductor module shown in FIG. 1.

The first semiconductor device 10 and the second semiconductor device 20 are vertical insulated gate semiconductor devices having an element structure as shown in FIG. 5. More specifically, the first semiconductor element 10 and the second semiconductor element 20 are power MOSFETs (Metal-Oxide-Semiconductor Field-Effect Transistors: MOSFETs).

The first semiconductor device 10 and the second semiconductor device 20 each include a semiconductor substrate 60, a source electrode 71, and a drain electrode 72. The source electrode 71 is formed in contact with an upper surface 60u of the semiconductor substrate 60. The drain electrode 72 is formed in contact with a lower surface 60b of the semiconductor substrate 60. In the semiconductor substrate 60, an n+ region 61, an n− region 62, and a p+ region 63 are stacked on each other in this stated order from the lower surface 60b side. An n+ region 64 is formed in a part of the p+ region 63 on the upper surface side. A trench 73 is provided which penetrates from the upper surface 60u of the semiconductor substrate 60 through the n+ region 64 and the p+ region 63, and reaches an upper surface side of the n− region 62. A gate insulating film 74 is formed on an inner wall surface of the trench 73, and a gate electrode 75 is filled in the trench 73 in a state of being insulated from the semiconductor substrate 60 by the gate insulating film 74. An upper surface of the gate electrode 75 is covered with an insulating film 76, and the gate electrode 75 and the source electrode 71 are insulated from each other by the insulating film 76. A material of the semiconductor substrate 60 is not particularly limited. The material may be, for example, silicon (Si), silicon carbide (SiC), or gallium nitride (GaN).

When a positive voltage is applied to the gate electrode 75 of each of the first semiconductor device 10 and the second semiconductor device 20, an n-type channel is provided in the p+ region 63 along the gate insulating film 74, and n-type carriers move from the source electrode 71 to the drain electrode 72 in the semiconductor substrate 60. As a result, a current flows from the drain electrode 72 to the source electrode 71. In the first semiconductor device 10 and the second semiconductor device 20, a gate voltage applied to the gate electrode 75 is controlled. Therefore, it is possible to perform on/off control of switching elements of the first semiconductor device 10 and the second semiconductor device 20. The source electrode 71 corresponds to a first electrode, and the source terminal electrically connected to the source electrode 71 among the external terminals corresponds to a first terminal. The drain electrode 72 corresponds to a second electrode, and a drain terminal electrically connected to the drain electrode 72 among the external terminals corresponds to a second terminal.

The first semiconductor device 10 and the second semiconductor device 20 are stacked with the source electrodes 71 facing upward (positive direction in the z-axis) and the drain electrodes facing downward (negative direction in the z-axis), and the first semiconductor device 10 is disposed on an upper side and the second semiconductor device 20 is disposed on a lower side. As shown in FIGS. 2 to 4, the first semiconductor device 10 is disposed so that a longitudinal direction of the first semiconductor device 10 is the y-axis direction when viewed from the top, and the second semiconductor device 20 is disposed so that a longitudinal direction of the second semiconductor device 20 is the x-axis direction when viewed from the top. When viewed from the top, the first semiconductor device 10 is disposed in an orientation of being rotated by substantially 90° counterclockwise around the vertical direction as an axis with respect to the second semiconductor device 20.

As shown in FIGS. 2 to 4, the semiconductor module 1 includes a first conductive member 121, a second conductive member 123, a first semiconductor device 10, a third conductive member 124, a fourth conductive member 125, a second semiconductor device 20, and an electrode pad 122 stacked in this stated order from the top. The semiconductor module 1 further includes conductive joining plates 105, 106, 115, and 116 at the same position as that of the electrode pads 122 in the vertical direction. The joining plate 105 is formed integrally with the external terminal 101. The joining plate 106 is formed integrally with the external terminals 102 to 104. The joining plate 115 is formed integrally with the external terminal 111. The joining plate 116 is formed integrally with the external terminals 112 to 114. The external terminals 101 to 104 and 111 to 114, the joining plates 105, 106, 115, and 116, and the electrode pad 122 are formed in a lead frame. The semiconductor module 1 further includes conductive gate connection members 107 and 117.

The second conductive member 123 corresponds to a source electrode formed on the upper surface side of the first semiconductor device 10. The second conductive member 123 has a shape in which one of four corners of a rectangle is notched when viewed from the top, and a gate pad of the first semiconductor device 10 is provided in the notched portion. The upper surface of the second conductive member 123 is joined to the lower surface of the first conductive member 121 through solder.

The first conductive member 121 has a substantially L-shaped shape when viewed from the top, and extends to a position above the joining plate 106 in the positive direction of the y-axis. The first conductive member 121 has a connection portion 121a extending downward to a position reaching the joining plate 106 at a position above the joining plate 106. A lower surface of the connection portion 121a is joined to an upper surface of the joining plate 106 through solder. As a result, the source electrode of the first semiconductor device 10 is electrically connected to the external terminals 102 to 104.

The lower surface side of the first semiconductor device 10 is the drain electrode side, and is joined to an upper surface of the third conductive member 124 through solder. The fourth conductive member 125 corresponds to a source electrode formed on the upper surface side of the second semiconductor device 20. The fourth conductive member 125 is joined to the third conductive member 124 through solder.

The third conductive member 124 has a substantially L-shaped shape when viewed from the top, and extends to a position above the joining plate 116 in the negative direction of the y-axis. The third conductive member 124 has a connection portion 124a extending downward to a position reaching the joining plate 116 at a position above the joining plate 116. A lower surface of the connection portion 124a is joined to an upper surface of the joining plate 116 through solder. The drain electrode of the first semiconductor device 10 and the source electrode of the second semiconductor device 20 are electrically connected to the external terminals 112 to 114. Although the first conductive member 121 and the third conductive member 124 are so-called clips, wire bonding, a wire ribbon, or the like may be used in addition to the clips.

The second conductive member 123 and the fourth conductive member 125 are source electrodes of the first semiconductor device 10 and the second semiconductor device 20, respectively, and have the same shape and size. Similar to a positional relationship between the first semiconductor device 10 and the second semiconductor device 20, the second conductive member 123 is disposed in an orientation of being rotated by substantially 90° counterclockwise around the vertical direction as the axis with respect to the fourth conductive member 125. With the above placement, the position of the gate pad of the first semiconductor device 10 is a position at an angle of the positive direction of the x-axis and the positive direction of the y-axis, whereas the position of the gate pad of the second semiconductor device 20 is a position at an angle of the positive direction of the x-axis and the negative direction of the y-axis.

The lower surface side of the second semiconductor device 20 is a drain electrode, and is joined to the electrode pad 122 through solder. As shown in FIG. 1B, the electrode pad 122 is exposed to a lower surface of the resin mold 130, and is electrically connected to the drain electrode of the second semiconductor device 20. The drain electrode of the second semiconductor device 20 is not electrically connected to any of the external terminals 101 to 104 and 111 to 114.

The gate connection member 107 includes a columnar portion extending in the vertical direction on an upper surface of the joining plate 105, and a beam portion extending from the columnar portion to the gate pad on the upper surface of the first semiconductor device 10 in an oblique direction which is a negative direction of the x-axis and the y-axis. A lower surface of the columnar portion is joined to an upper surface of the joining plate 105 through solder. The beam portion is electrically connected to the gate electrode in the first semiconductor device 10 through the gate pad. The gate electrode of the first semiconductor device 10 is electrically connected to the external terminal 101.

The gate connection member 117 includes a columnar portion extending in the vertical direction on an upper surface of the joining plate 115, and a beam portion extending from the columnar portion in the positive direction of the y-axis to the gate pad on the upper surface of the second semiconductor device 20. The lower surface of the columnar portion is joined to the upper surface of the joining plate 115 through solder. In the second semiconductor device 20, the beam portion is electrically connected to the gate electrode through the gate pad. The gate electrode of the second semiconductor device 20 is electrically connected to the external terminal 111. The gate connection members 107 and 117 are so-called gate clips, but wire bonding, wire ribbon, or the like may be used in addition to the clips.

The external terminal 101 is a first gate terminal G1 electrically connected to the gate electrode of the first semiconductor device 10. The external terminal 111 is a second gate terminal G2 electrically connected to the gate electrode 75 of the second semiconductor device 20.

The first gate terminal G1 is disposed on the most positive side of the x-axis in the positive direction of the y-axis. The second gate terminal G2 is disposed on the most positive side of the x-axis in the negative direction of the y-axis. The first gate terminal G1 and the second gate terminal G2 are disposed at positions substantially line symmetrical with respect to a line segment L1 extending in the x-axis direction. Since the x-axis and the y-axis are orthogonal to each other, the line segment L1 corresponds to a line segment substantially orthogonal to the first direction and the second direction.

The external terminals 102 to 104 are a first source terminal S1 electrically connected to the source electrode of the first semiconductor device 10. The external terminals 112 to 114 are a second source terminal S2 electrically connected to the source electrode of the second semiconductor device 20 and are also a first drain terminal D1 electrically connected to the drain electrode of the first semiconductor device 10.

The external terminal, which is adjacent to the external terminal 101 as the first gate terminal G1, is only the external terminal 102 as the first source terminal S1. The external terminal 101 as the first gate terminal G1 is not adjacent to any of the external terminals 112 to 114 as the first drain terminal D1. The external terminal, which is adjacent to the external terminal 111 as the second gate terminal G2, is only the external terminal 112 as the second source terminal S2 and the first drain terminal D1. Since the second drain terminal is not included as the external terminal, the second gate terminal G2 and the second drain terminal D2 are not adjacent to each other. In the semiconductor module 1, the gate terminal and the drain terminal electrically connected to the same semiconductor device are not adjacent to each other.

About the adjacent state of the external terminals, "the gate terminal and the drain terminal are not adjacent to each other" refers to a state in which a structure or the like such as another external terminal (for example, a source terminal) exists between the gate terminal and the drain terminal, or a state in which the gate terminal and the drain terminal are separated from each other by a sufficiently long distance as compared with a terminal length of each terminal, and even when each terminal is curved or the like, the gate terminal and the drain terminal are not in contact with each other. In other words, "the gate terminal and the drain terminal are not adjacent to each other" may also refer to a situation where the gate terminal and the drain terminal are discontinuous without contact.

Figure 6:
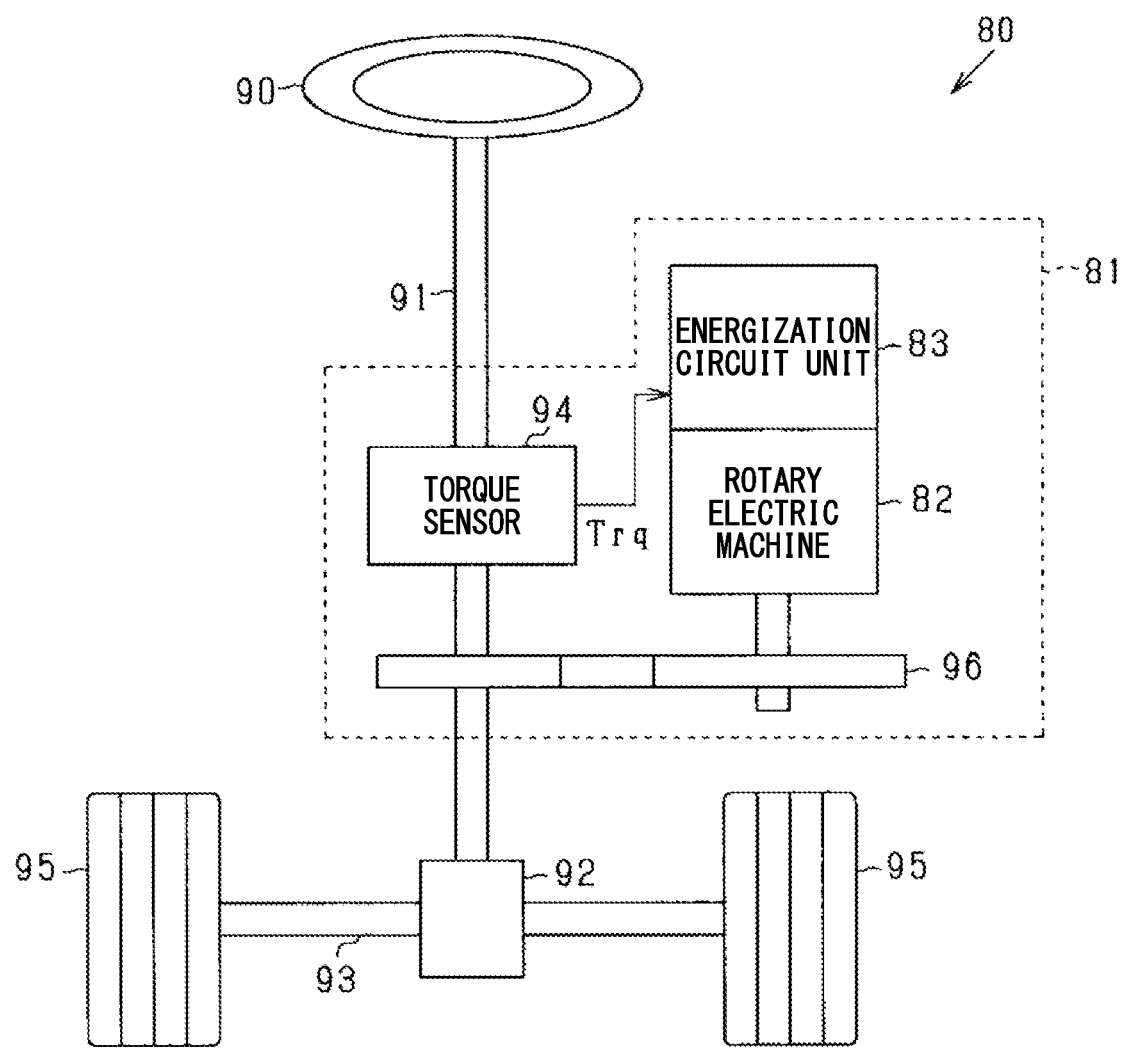
FIG. 6 is a schematic diagram of an electric power steering system to which the semiconductor module according to the first embodiment is applied.

The control device according to the present embodiment may be applied to a drive circuit of an electric power steering system (EPS) 80 for a vehicle as shown in FIG. 6. The EPS 80 includes a steering wheel 90, a steering shaft 91, a pinion gear 92, a rack shaft 93, and an EPS device 81. The steering shaft 91 is connected to the steering wheel 90. The pinion gear 92 is provided at a tip of the steering shaft 91. The pinion gear 92 meshes with the rack shaft 93. Wheels 95 are rotatably connected to both ends of the rack shaft 93 through tie rods or the like. When a driver rotates the steering wheel 90, the steering shaft 91 rotates. Rotational motion of the steering shaft 91 is converted into linear motion of the rack shaft 93 by the pinion gear 92, and the wheels 95 are steered to a steering angle corresponding to the amount of displacement of the rack shaft 93.

The EPS device 81 includes a torque sensor 94, a speed reducer 96, a rotary electric machine 82, and an energization circuit unit 83. The torque sensor 94 is provided on the steering shaft 91, and detects a steering torque Trq which is an output torque of the steering shaft 91. The rotary electric machine 82 generates an assisting torque corresponding to the detected steering torque Trq and a steering direction of the steering wheel 90. The energization circuit unit 83 performs a drive control of the rotary electric machine 82. The speed reducer 96 transmits the assisting torque to the steering shaft 91 while reducing the rotation of a rotation shaft of a rotor of the rotary electric machine 82.

Figure 7:
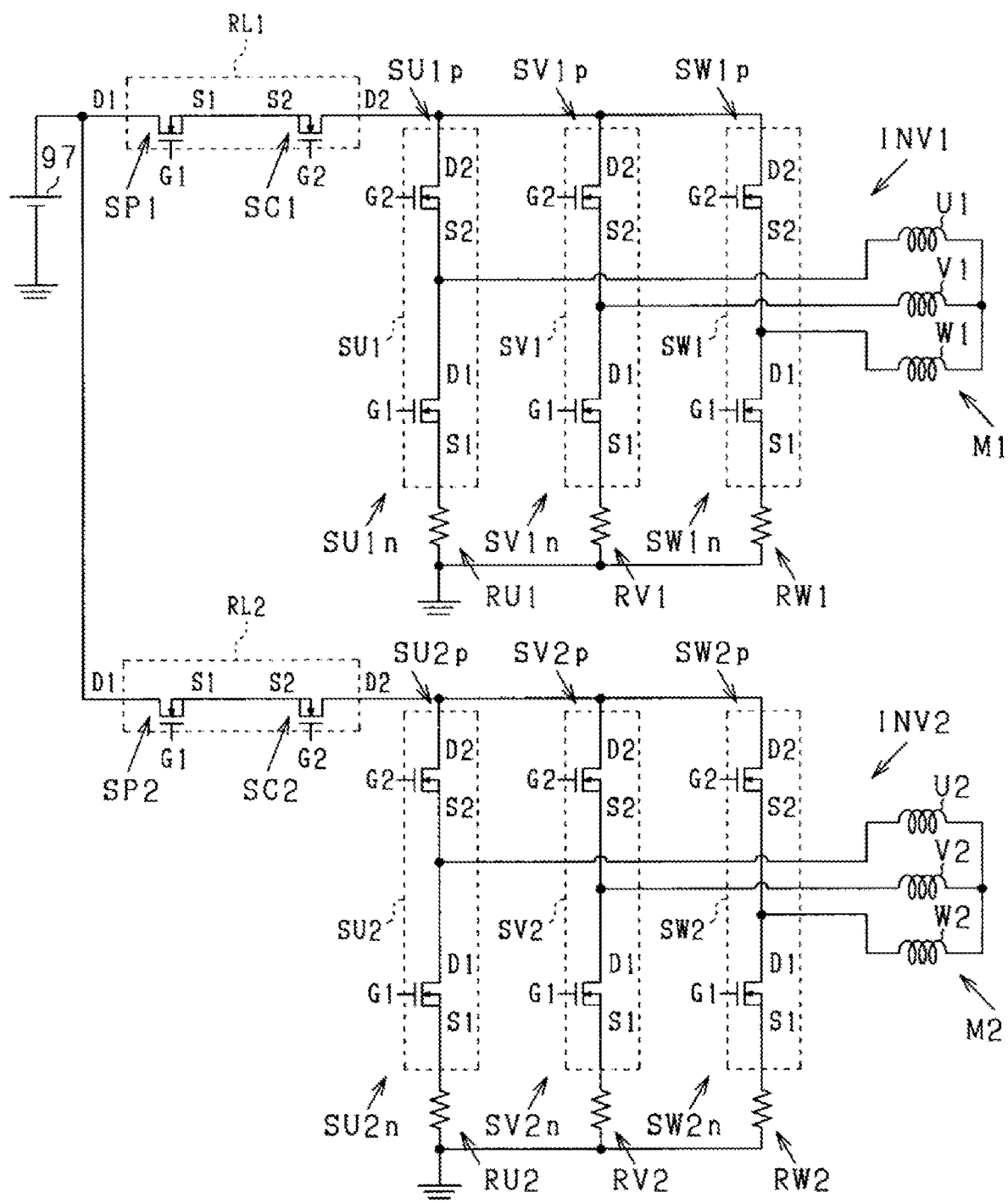
FIG. 7 is a diagram showing a drive circuit of the electric power steering system shown in FIG. 6.
Figure 8A:
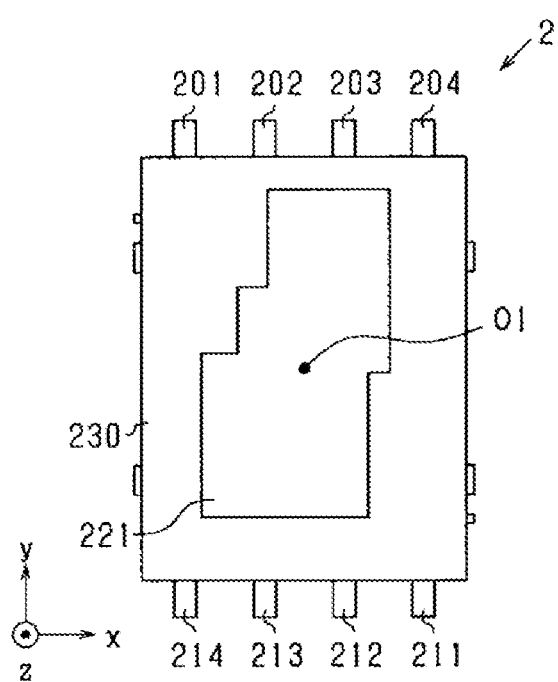
FIG. 8A is a plan view showing a semiconductor module according to a second embodiment.
Figure 8B:
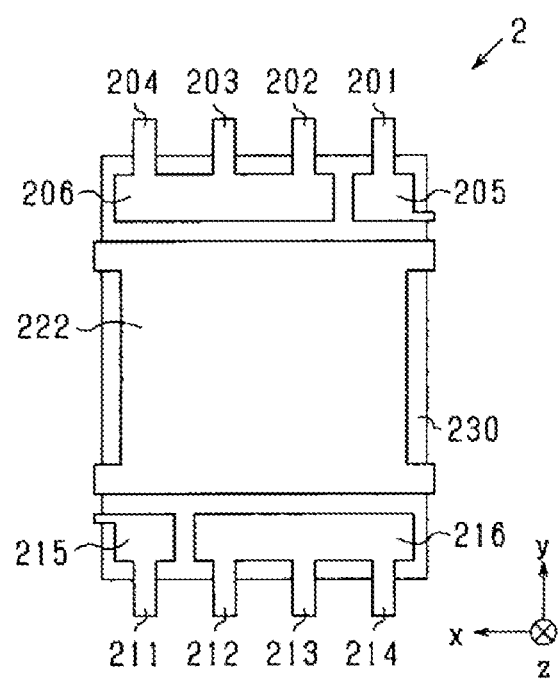
FIG. 8B is a plan view showing a semiconductor module according to the second embodiment.
Figure 9:
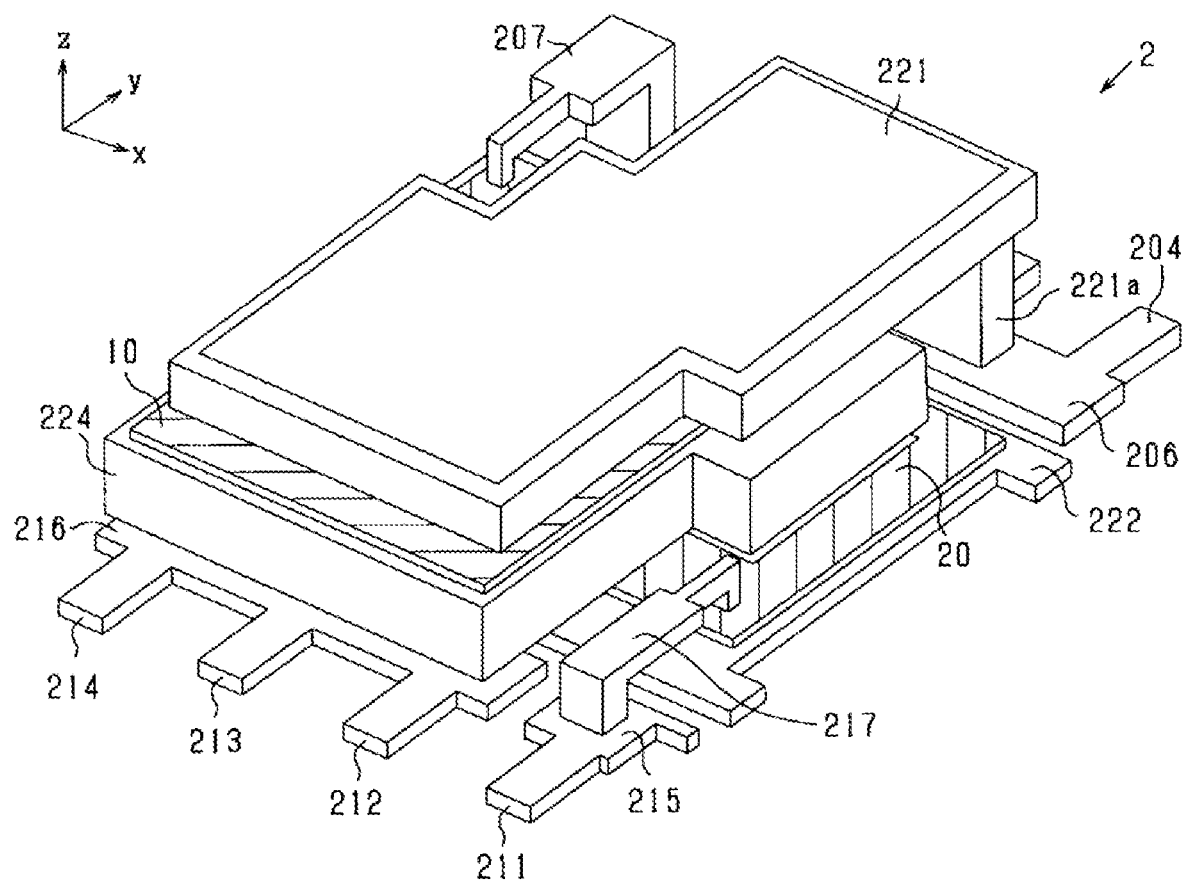
FIG. 9 is a perspective view showing a state in which a resin mold is removed in the semiconductor module shown in FIGS. 8A, 8B.
Figure 10:
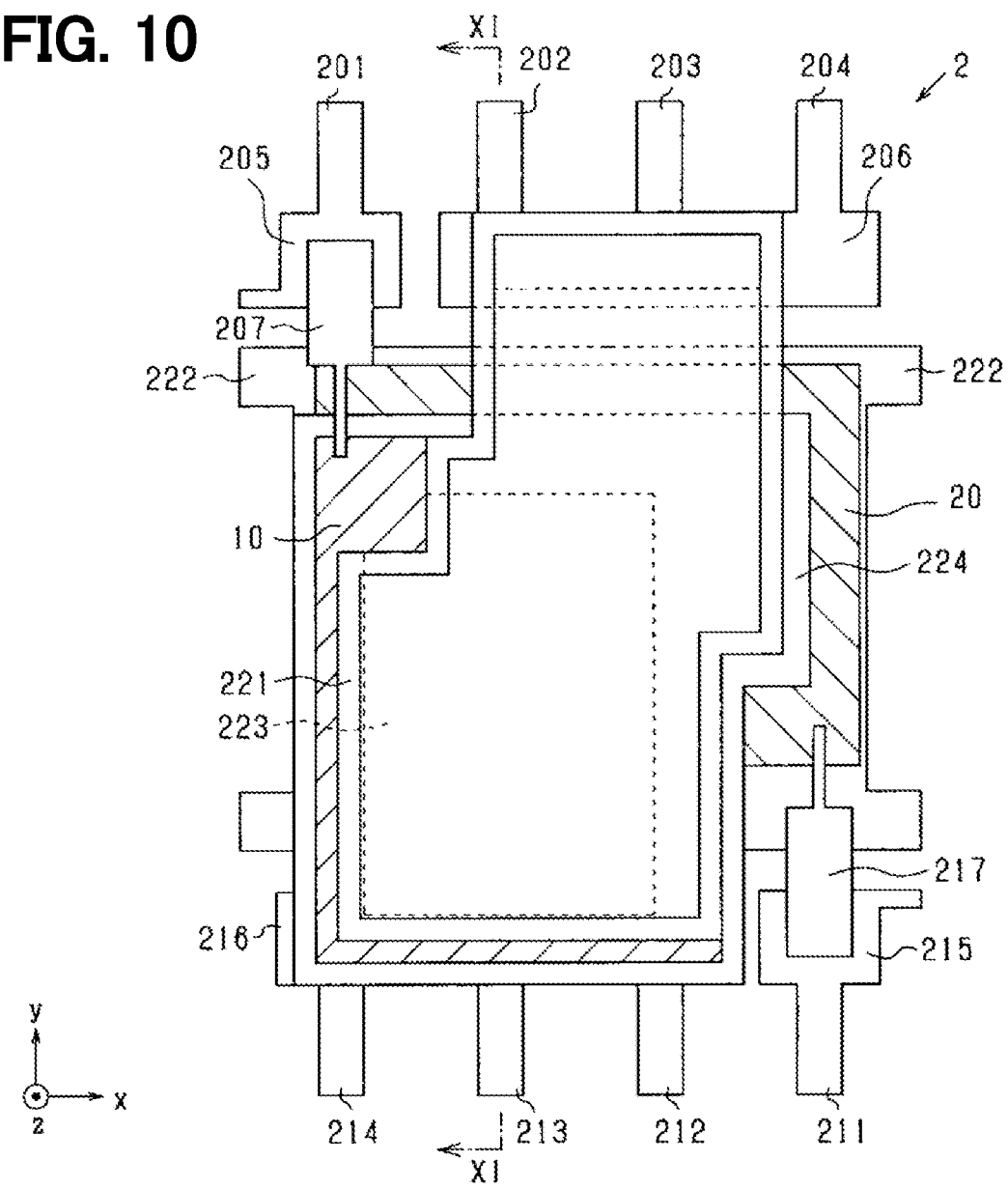
FIG. 10 is a plan view showing a state in which the resin mold is removed in the semiconductor module shown in FIGS. 8A, 8B.
Figure 11:
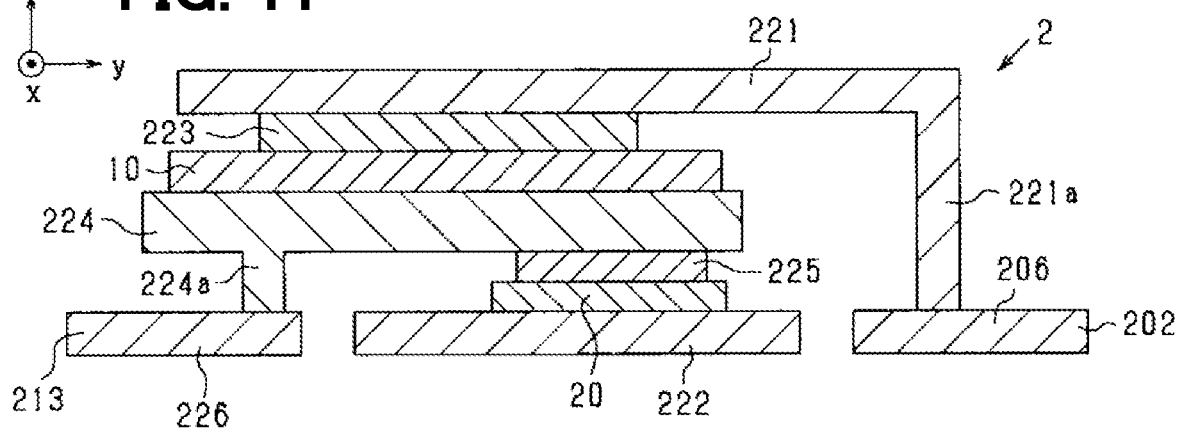
FIG. 11 is a cross-sectional view taken along a line XI-XI of FIG. 11.

As shown in FIG. 7, a permanent magnet field type or a winding field type may be used as the rotary electric machine 82. A stator of the rotary electric machine 82 includes a first winding group M1 and a second winding group M2. The first winding group M1 includes a star-connected first U-phase winding U1, a first V-phase winding V1, and a first W-phase winding W1, and the second winding group M2 includes a star-connected phase second U-phase winding U2, a second V-phase winding V2, and a second W-phase winding W2. Respective first ends of the first U-phase winding U1, the first V-phase winding V1, and the first W-phase winding W1 are connected to each other at a neutral point. The first U-phase winding U1, the first V-phase winding V1, and the first W-phase winding W1 are shifted by 120° at an electric angle θe. Respective first ends of the second U-phase winding U2, the second V-phase winding V2, and second W-phase winding W2 are connected to each other at a neutral point. The second U-phase winding U2, the second V-phase winding V2, and the second W-phase winding W2 are shifted by 120° at an electric angle θe.

The energization circuit unit 83 includes a first inverter INV1 and a second inverter INV2 as power converters, and a first relay RL1 and a second relay RL2 as power supply relays.

In the first inverter INV1, a second end of the first U-phase winding U1 is connected to a connection point between an upper arm switch SU1$p$ and a lower arm switch SU1$n$ of a first U phase. A second end of the first V-phase winding V1 is connected to a connection point between an upper arm switch SV1$p$ and a lower arm switch SV1$n$ of a first V phase. A second end of the first W-phase winding W1 is connected to a connection point between an upper arm switch SW1$p$ and a lower arm switch SW1$n$ of a first W phase. In the second inverter INV2, a second end of the second U-phase winding U1 is connected to a connection point between an upper arm switch SU2$p$ and a lower arm switch SU2$n$ of a second U phase. A second end of the second V-phase winding V2 is connected to a connection point between an upper arm switch SV2$p$ and a lower arm switch SV2$n$ of a second V phase. A second end of the second W-phase winding W2 is connected to a connection point between an upper arm switch SW2$p$ and a lower arm switch SW2$n$ of a second W phase.

The high-potential side terminals of the upper arm switch SU1$p$ of the first U phase, the upper arm switch SV1$p$ of the first V phase, the upper arm switch SW1$p$ of the first W-phase are connected to a positive electrode terminal of a battery 97, which is a DC power supply, through the first relay RL1. The low-potential side terminals of the lower arm switch SU1$n$ of the first U phase, the lower arm switch SV1$n$ of the first V phase, the lower arm switch SW1$n$ of the first W-phase are connected to the ground through resistors RU1, RV1, and RW1, respectively. The high-potential side terminals of the upper arm switch SU2$p$ of the second U phase, the upper arm switch SV2$p$ of the second V phase, and the upper arm switch SW2$p$ of the second W-phase are connected to a positive electrode terminal of the battery 97 through the second relay RL2. The low-potential side terminals of the lower arm switch SU2$n$ of the second U phase, the lower arm switch SV2$n$ of the second V phase, and the lower arm switch SW2$n$ of the second W-phase are connected to the ground through resistors RU2, RV2, and RW2, respectively. A negative electrode terminal of the battery 97 is connected to the ground.

As the switches SU1$p$ to SW2$n$, a MOSFET such as the first semiconductor device 10 and the second semiconductor device 20 may be used. Each of two switches SU1$p$ and SU1$n$, SV1$p$ and SV1$n$, SW1$p$ and SW1$n$, SU2$p$ and SU2$n$, SV2$p$ and SV2$n$, SW2$p$ and SW2$n$ connected in series in each arm are connected in series by connecting the source electrode of the former MOSFET and the drain electrode of the latter MOSFET.

The semiconductor module 1 may be used as semiconductor modules SU1, SV1, SW1, SU2, SV2, and SW2 in which two switches SU1$p$ and SU1$n$, SV1$p$ and SV1$n$, SW1$p$ and SW1$n$, SU2$p$ and SU2$n$, SV2$p$ and SV2$n$, and SW2$p$ and SW2$n$ connected in series in each arm are integrated together.

When the semiconductor module 1 is used as the semiconductor modules SU1 to SW2, the upper arm switches SU1$p$, SV1$p$, SW1$p$, SU2$p$, SV2$p$, and SW2$p$ correspond to the second semiconductor device 20; and the lower arm switches SU1$n$, SV1$n$, SW1$n$, SU2$n$, SV2$n$, and SW2$n$ correspond to the first semiconductor device 10. The electrode pad 122 of the semiconductor module 1 is connected to the side of the power supply relay RL1 and RL2, and the external terminals 102 to 104 are connected to the side of the resistors RU1 to RW2. Therefore, the semiconductor module 1 may be applied to the first inverter INV1 and the second inverter INV2 to configure an inverter circuit.

As the switches SP1 and SC1 configuring the power supply relay RL1 and the switches SP2 and SC2 configuring the power supply relay RL2, a MOSFET such as the first semiconductor device 10 and the second semiconductor device 20 may be used. The switches SP1 and SP2 are power supply relay switches, and the switches SC1 and SC2 are reverse connection protective relays. The two switches SP1 and SC1, and SP2 and SC2 connected in series in each arm are connected in series by connecting the source electrodes of the MOSFETs to each other.

When the MOSFETs such as the first semiconductor device 10 and the second semiconductor device 20 are used as the switches SU1p to SW2n, SP1, SC1, SP2, and SC2, the body diodes of the MOSFETs may be used as freewheeling diodes. In FIG. 7, the freewheeling diodes connected in anti-parallel to the respective switches SU1p to SW2n, SP1, SC1, SP2, and SC2 are not shown, but the freewheeling diodes may be connected to the respective switches SU1p to SW2n, SP1, SC1, SP2, and SC2.

The energization circuit unit 83 detects currents flowing through the resistors RU1, RV1, and RW1 and outputs the detected currents as a first U-phase current Iur1, a first V-phase current Ivr1, and a first W-phase current Iwr1. The energization circuit unit 83 further detects the currents flowing through the resistors RU2, RV2, and RW2 and outputs the detected currents as a second U-phase current Iur2, a second V-phase current Ivr2, and a second W-phase current Iwr2.

The energization circuit unit 83 includes an ECU configured by a microcomputer, and the ECU operates the switches of the first inverter INV1 and the second inverter INV2 to control a torque of the rotary electric machine 82 to reach a torque command value Tr*. The torque command value Tr* is set based on, for example, a steering torque Trq detected by the torque sensor 94. The energization circuit unit 83 calculates an electric angle θe of the rotary electric machine 82 by the ECU based on an output signal of an angular sensor. The angle sensor may be, for example, an angular sensor including a magnet which is a magnetic generation portion provided on a rotor side of the rotary electric machine 82 and a magnetic detection element provided close to the magnet. The functions provided by the ECU may be provided, for example, by software stored in a tangible memory device and a computer causing the software to be executed, hardware, or a combination of the software, the computer, and the hardware.

The semiconductor module 1 may be applied to the EPS 80, and may be applied to the energization circuit unit 83 corresponding to a drive circuit of the EPS 80 as the semiconductor modules SU1 to SW2 including two switches connected in series with each other.

The semiconductor module 1 may be applied to each of inverter circuits shown as the first inverter INV1 and the second inverter INV2, and the first semiconductor device 10 and the second semiconductor device 20 are applied to the inverter circuit as switching elements connected in series with each other.

The semiconductor module obtained by inverting the top and bottom of the first semiconductor device 10 with respect to the semiconductor module 1 may be applied to the power supply relays RL1 and RL2 shown in FIG. 7. In this situation, for example, the first conductive member 121 is extended to the joining plate 116 side instead of the joining plate 106 and joined to the joining plate 106, and the third conductive member 124 is extended to the joining plate 106 side instead of the joining plate 116 and joined to the joining plate 116. With the substitution described above, the external terminals 102 to 104 function as the first source terminal S1 and the second source terminal S2. The external terminals 112 to 114 serve as the first drain terminal D1. As a result, the gate terminal and the drain terminal electrically connected to the same semiconductor device are not adjacent to each other.

Second Embodiment

As shown in FIGS. 8A to 11, in a semiconductor module 2 according to a second embodiment, when viewed from the top, a first semiconductor device 10 is disposed in an orientation of being rotated counterclockwise by approximately 90° around a vertical direction as an axis with respect to a second semiconductor device 20. The semiconductor module 2 is similar to the semiconductor module 1.

The semiconductor module 2 includes a first conductive member 221, a second conductive member 223, a first semiconductor device 10, a third conductive member 224, a fourth conductive member 225, a second semiconductor device 20, and an electrode pad 222 stacked in this stated order from the top. The semiconductor module 2 further includes external terminals 201 to 204 and 211 to 214 and conductive joining plates 205, 206, 215, and 216 at the same position as that of the electrode pads 222 in the vertical direction. The semiconductor module 2 further includes gate connection members 207 and 217.

In the semiconductor module 2, the external terminals 201 to 204 are disposed in this stated order from the negative direction to the positive direction of the x-axis, opposite to an arrangement of the external terminals 101 to 104. Correspondingly, the joining plate 205 is disposed on the negative side of the x-axis, and the joining plate 206 is disposed on the positive side of the x-axis.

Corresponding to the placement of the joining plate 205, when viewed from the top, the second conductive member 223 is shaped to notch a position of a corner in the negative direction of the x-axis and the positive direction of the y-axis, which is closest to the joining plate 205, among four corners of a rectangle. A gate pad of the first semiconductor device 10 is provided in the notched portion. When viewed from the top, the fourth conductive member 225 is shaped to notch a position of a corner in the positive direction of the x-axis and the negative direction of the y-axis, which is closest to the joining plate 215, among four corners of a rectangle. A gate pad of the second semiconductor device 20 is provided in the notched portion. In the second embodiment, the first semiconductor device 10 and the second semiconductor device 20 are the same in shape and size, but are different from the first embodiment in that the position of the gate pad is different.

The gate connection member 207 is disposed on the negative side of the x-axis, which is opposite to a situation of disposing the gate connection member 107. The gate connection member 207 includes a columnar portion extending in the vertical direction on an upper surface of the joining plate 205, and a beam portion extending from the columnar portion in the negative direction of the y-axis to an upper surface of the first semiconductor device 10. Other configurations in the semiconductor module 2 are identical with those of the semiconductor module 1, and therefore a description of those configurations will be omitted.

The external terminal 201 is a first gate terminal G1 electrically connected to the gate electrode of the first semiconductor device 10. The external terminal 211 is a second gate terminal G2 electrically connected to the gate electrode of the second semiconductor device 20.

The first gate terminal G1 is disposed on the most negative side of the x-axis in the positive direction of the y-axis. The second gate terminal G2 is disposed on the most positive side of the x-axis in the negative direction of the y-axis. The first gate terminal G1 and the second gate terminal G2 are disposed at positions substantially point symmetrical with respect to a center O1 when the resin mold 230 is viewed from the top. The center O1 is positioned in the center of the resin mold 230 in the x-axis direction and the center of the resin mold 230 in the y-axis direction.

The external terminals 202 to 204 are a first source terminal S1 electrically connected to the source electrode of the first semiconductor device 10. The external terminals 212 to 214 are a second source terminal S2 electrically connected to the source electrode of the second semiconductor device 20 and are also a first drain terminal D1 electrically connected to the drain electrode of the first semiconductor device 10.

The external terminal, which is adjacent to the external terminal 201, is only the external terminal 202. The external terminal 201 is the first gate terminal G1, and the external terminal 202 is the first source terminal S1. The external terminal 201 as the first gate terminal G1 is not adjacent to any of the external terminals 212 to 214 as the first drain terminal D1. The external terminal, which is adjacent to the external terminal 211, is only the external terminal 212. The external terminal 211 is the second gate terminal G2, and the external terminal 212 is the second source terminal S2 and the first drain terminal D1. Since the second drain terminal D2 is not included as the external terminal, the second gate terminal G2 and the second drain terminal D2 are not adjacent to each other. In the semiconductor module 2, the gate terminal and the drain terminal electrically connected to the same semiconductor device are not adjacent to each other.

The first gate terminal G1 and the second gate terminal G2 may be disposed at positions substantially point symmetrical with respect to a center O1 when the resin mold 230 is viewed from the top. Even in the configuration described above, the gate terminal and the drain terminal electrically connected to the same semiconductor device may be prevented from being adjacent to each other. The semiconductor module 2 may be applied to the EPS 80. More specifically, the semiconductor module 2 may be applied to inverter circuits shown as the first inverter INV1 and the second inverter INV2.

Third Embodiment

Figures 12A, 12B:
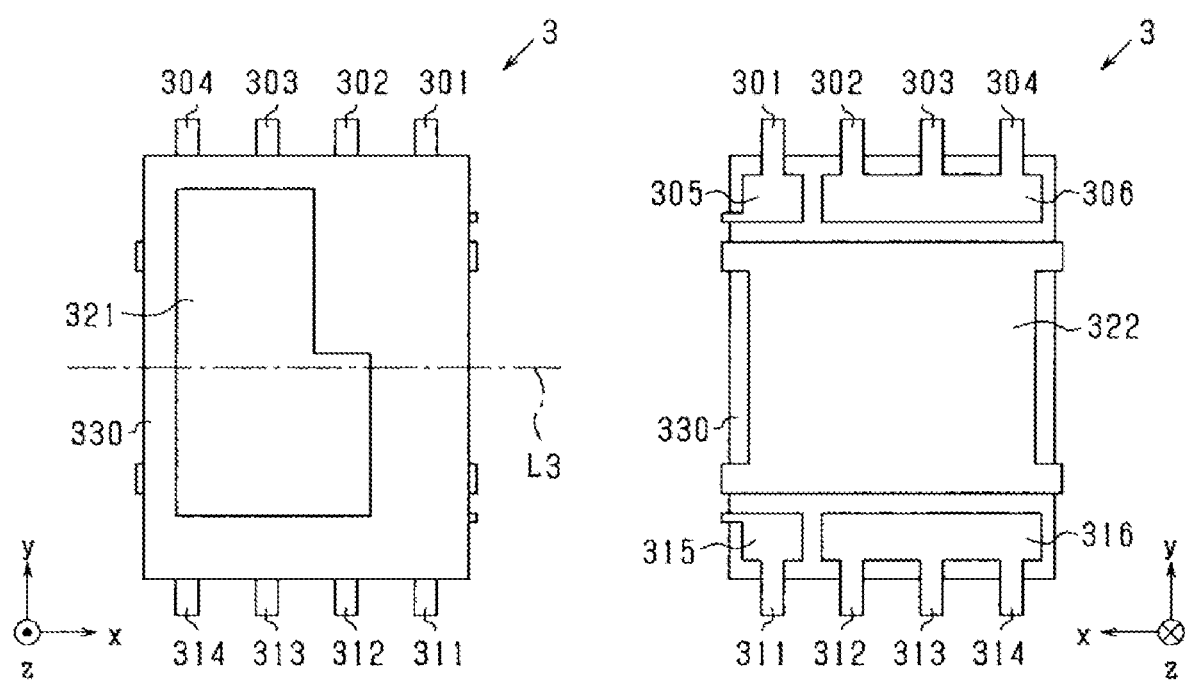
FIG. 12A is a plan view showing a semiconductor module according to a third embodiment.
FIG. 12B is a plan view showing a semiconductor module according to the third embodiment.
Figure 13:
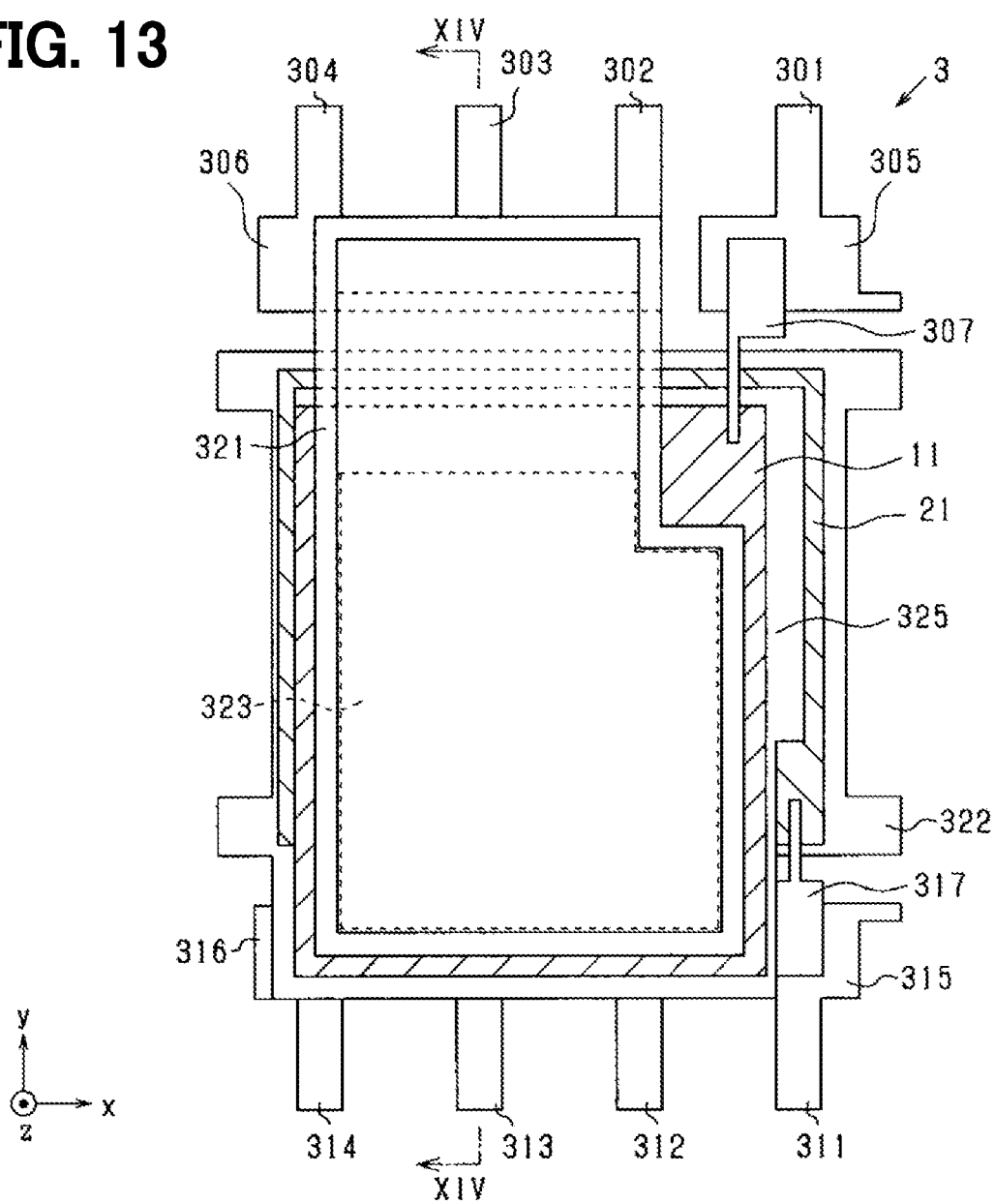
FIG. 13 is a plan view showing a state in which a resin mold is removed in the semiconductor module shown in FIG. 12A and FIG. 12B.
Figure 14:
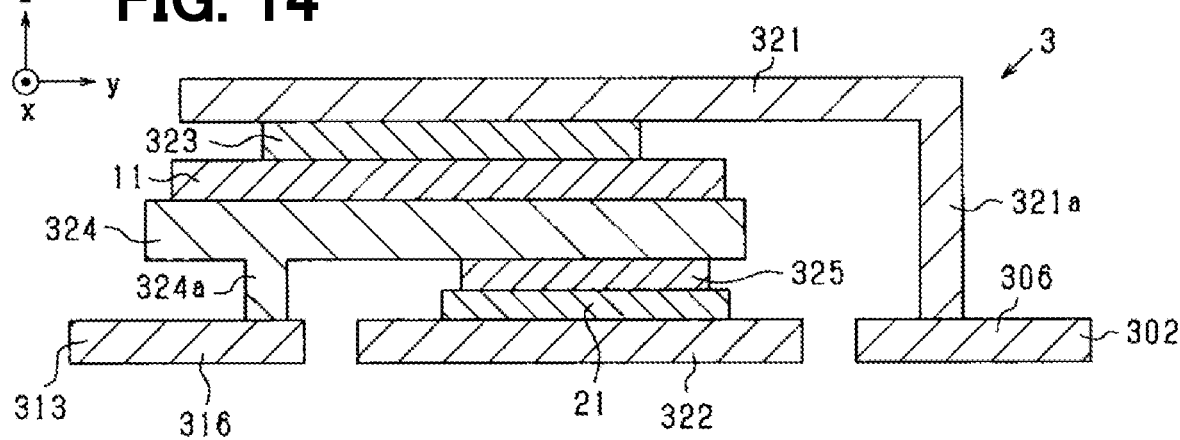
FIG. 14 is a cross-sectional view taken along a line XIV-XIV of FIG. 13.

As shown in FIGS. 12 to 14, a semiconductor module 3 according to a third embodiment is different from the semiconductor module 1 in that a first semiconductor device 11 and a second semiconductor device 21 are provided instead of the first semiconductor device 10 and the second semiconductor device 20. The first semiconductor device 11 and the second semiconductor device 21 are semiconductor devices having the same structure, shape, size, and the like. As compared to the first semiconductor device 10 and the second semiconductor device 20, the first semiconductor device 11 and the second semiconductor device 21 have a longer length in a short-side direction (in other words, the x-axis direction in FIGS. 12A to 14) in a substantially rectangular shape when viewed from the top.

The first semiconductor device 11 is disposed such that a longitudinal direction when viewed from the top is in the y-axis direction, and the second semiconductor device 21 is disposed such that a longitudinal direction when viewed from the top is in the x-axis direction. When viewed from the top, the first semiconductor device 11 is disposed in an orientation of being rotated by substantially 90° counterclockwise around the vertical direction as an axis with respect to the second semiconductor device 21.

The semiconductor module 3 includes a first conductive member 321, a second conductive member 323, a first semiconductor device 11, a third conductive member 324, a fourth conductive member 325, a second semiconductor device 21, and an electrode pad 322 stacked in this stated order from the top. The semiconductor module 3 further includes external terminals 301 to 304 and 311 to 314 and conductive joining plates 305, 306, 315, and 316 at the same position as that of the electrode pads 322 in the vertical direction. The semiconductor module 3 further includes gate connection members 307 and 317.

In the semiconductor module 3, the sizes of the first conductive member 321, the third conductive member 324, and the electrode pad 322 are enlarged in the positive direction of the x-axis in accordance with the sizes of the first semiconductor device 11 and the second semiconductor device 21. For example, in the first conductive member 321, the connection portion 321a to be joined to the joining plate 306 extends in the positive direction of the x-axis to the same position as that of the external terminal 302. The beam portion of the gate connection member 307 extends from the columnar portion in the negative direction of the y-axis to the upper surface of the first semiconductor device 11. Other configurations in the semiconductor module 3 are the same as those of the semiconductor module 1, and therefore a description of those configurations will be omitted.

The external terminal 301 is a first gate terminal G1 electrically connected to the gate electrode of the first semiconductor device 11. The external terminal 311 is a second gate terminal G2 electrically connected to the gate electrode of the second semiconductor device 21. The first gate terminal G1 and the second gate terminal G2 are disposed at positions substantially line symmetrical with respect to a line segment L3 extending in the x-axis direction.

The external terminals 302 to 304 are a first source terminal S1 electrically connected to the source electrode of the first semiconductor device 11. The external terminals 312 to 314 are a second source terminal S2 electrically connected to the source electrode of the second semiconductor device 21, and are also a first drain terminal D1 electrically connected to the drain electrode of the first semiconductor device 10.

The external terminal, which is adjacent to the external terminal 301, is only the external terminal 302. The external terminal 301 is the first gate terminal G1, and the external terminal 302 is the first source terminal S1. The external terminal 301 as the first gate terminal G1 is not adjacent to any of the external terminals 312 to 314 as the first drain terminal D1. The external terminal, which is adjacent to the external terminal 311, is only the external terminal 312. The external terminal 311 is the second gate terminal G2, and the external terminal 312 is the second source terminal S2 and the first drain terminal D1. Since the second drain terminal D2 is not included as the external terminal, the second gate terminal G2 and the second drain terminal D2 are not adjacent to each other. In the semiconductor module 3, the gate terminal and the drain terminal electrically connected to the same semiconductor device are not adjacent to each other.

Even when the first semiconductor device 11 and the second semiconductor device 21, which are relatively large, are provided as in the semiconductor module 3, the sizes and shapes of the first conductive member 321, the third conductive member 324, the gate connection members 307 and 317, and the electrode pad 322 may be adjusted. The first conductive member 321, the third conductive member 324 and the gate connection members 307, 317 are clips. Therefore, it is possible to realize the same external terminal configuration as that of the semiconductor module 1. In the semiconductor modules 1 to 3, even when the shapes and sizes of the first semiconductor devices 10 and 11 and the second semiconductor devices 20 and 21 are changed, the same placement of the external terminals as those of the semiconductor modules 1 to 3 may be realized by adjusting the sizes and shapes of the clip and the electrode pad 322.

In the semiconductor modules 1 to 3, the situation where the sizes of the first semiconductor device and the second semiconductor device are the same has been described as an example. However, the placement of the external terminals similar to those of the semiconductor modules 1 to 3 may be realized by use of the first semiconductor device and the second semiconductor device having different sizes. For example, even when the third conductive member 124, the fourth conductive member 125, the second semiconductor device 20, and the electrode pad 122 in the semiconductor module 1 are respectively replaced with the third conductive member 324, the fourth conductive member 325, the second semiconductor device 21, and the electrode pad 322 in the semiconductor module 3, the first gate terminal G1 and the second gate terminal G2 may be placed in line symmetry. Even when the first semiconductor device and the second semiconductor device having different sizes are used, the gate terminal and the drain terminal electrically connected to the same semiconductor device may be prevented from being adjacent to each other.

Fourth Embodiment

Figure 15:
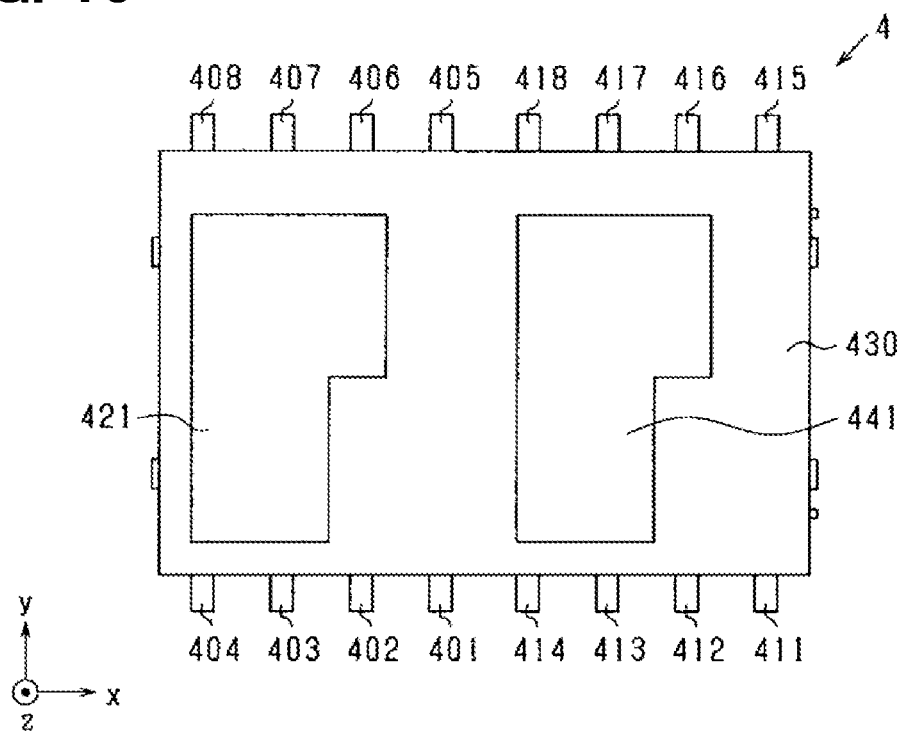
FIG. 15 is a plan view showing a semiconductor module according to a fourth embodiment.

As shown in FIG. 15, in a semiconductor module 4 according to a fourth embodiment, a first semiconductor device 10 and a second semiconductor device 20 are disposed side by side in an x-axis direction. The first semiconductor device 10 and the second semiconductor device 20 are disposed so that a gate pad is in a positive direction of the x-axis and a negative direction of the y-axis in an orientation in which a longitudinal direction and a y-axis coincide with each other.

In the semiconductor module 4, a first conductive member 421 has the same shape as that of the first conductive member 121. The first conductive member 421 is joined to an upper surface of a source electrode of a first semiconductor device 10, and is joined to an upper surface of a joining plate (not shown) formed integrally with external terminals 402 to 404 at a connection portion. A drain electrode of the first semiconductor device 10 is joined to an upper surface of a joining plate (not shown) formed integrally with external terminals 405 to 408. An external terminal 401 and a gate electrode of the first semiconductor device 10 are electrically connected to each other through a gate connection member (not shown).

In the semiconductor module 4, a first conductive member 441 has the same shape as that of the first conductive member 121. The first conductive member 441 is joined to an upper surface of a source electrode of a second semiconductor device 20, and is joined to an upper surface of a joining plate (not shown) formed integrally with external terminals 412 to 414 at a connection portion. A drain electrode of the second semiconductor device 20 is joined to an upper surface of a joining plate (not shown) formed integrally with external terminals 415 to 418. An external terminal 411 and a gate electrode of the second semiconductor device 20 are electrically connected to each other through a gate connection member (not shown).

The external terminal 401 is a first gate terminal G1 electrically connected to the gate electrode of the first semiconductor device 10. The external terminal 411 is a second gate terminal G2 electrically connected to the gate electrode of the second semiconductor device 20.

The external terminals 402 to 404 are a first source terminal S1 electrically connected to the source electrode of the first semiconductor device 10. The external terminals 412 to 414 are a second source terminal S2 electrically connected to the source electrode of the second semiconductor device 20.

The external terminals 405 to 408 are a first drain terminal D1 electrically connected to the drain electrodes of the first semiconductor device 10. The external terminals 415 to 418 are a second drain terminal D2 electrically connected to the drain electrodes of the second semiconductor device 20.

The external terminal, which is adjacent to the external terminal 401, is only the external terminal 402 and the external terminal 414. The external terminal 401 is the first gate terminal G1. The external terminal 402 is the first source terminal S1. The external terminal 414 is the second source terminal S2. The external terminal 401 is not adjacent to any of the external terminals 405 to 408. The external terminals 405 to 408 are the first drain terminal D1. The external terminal, which is adjacent to the external terminal 411, is only the external terminal 412. The external terminal 411 is the second gate terminal G2, and the external terminal 412 is the second source terminal S2. The external terminal 411 is not adjacent to any of the external terminals 415 to 418. The external terminals 415 to 418 are the second drain terminal D2. In the semiconductor module 4, the gate terminal and the drain terminal electrically connected to the same semiconductor device are not adjacent to each other.

Even when the first semiconductor device 10 and the second semiconductor device 20 are not overlapped with each other and disposed side by side as in the semiconductor module 4, the first gate terminal G1 and the first drain terminal D1 are not adjacent to each other, and the second gate terminal G2 and the second drain terminal D2 are not adjacent to each other.

The semiconductor module 4 may be applied to both the first inverter INV1 and the second inverter INV2 shown in FIG. 7 and the power supply relays RL1 and RL2 by adjusting the connections between the external terminals 402 to 408 and 412 to 418. With the connection between the first source terminal S1 and the second drain terminal D2, the semiconductor module 4 may be used as the semiconductor modules SU1, SV1, SW1, SU2, SV2, and SW2. With the connection between the first source terminal S1 and the second source terminal S2, the semiconductor module 4 may be used as the power supply relays RL1 and RL2.

Fifth Embodiment

Figure 16:
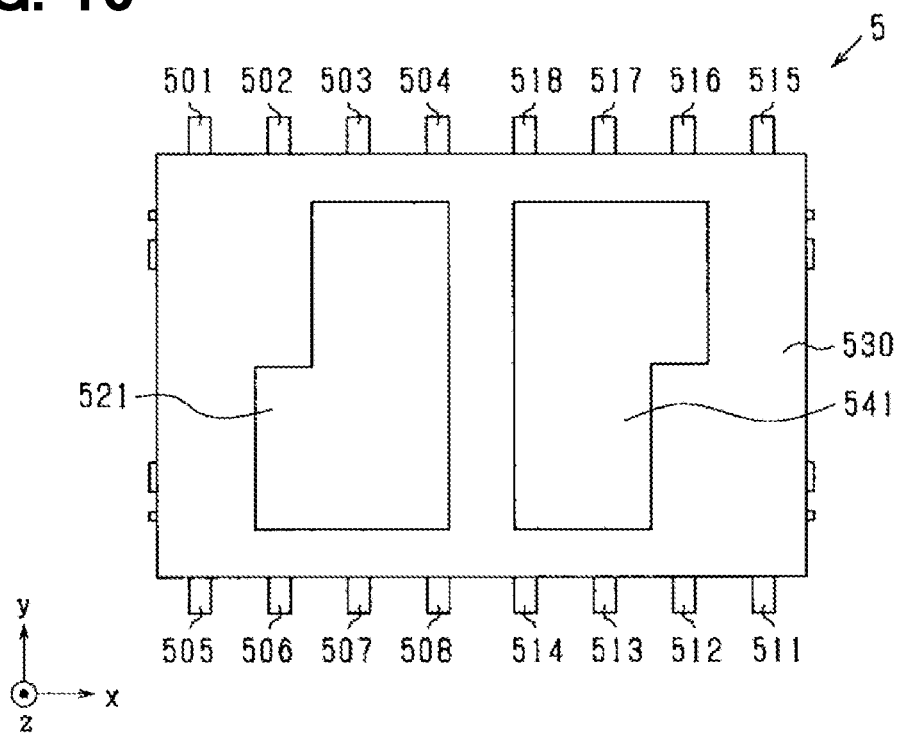
FIG. 16 is a plan view showing a semiconductor module according to a fifth embodiment.

As shown in FIG. 16, in a semiconductor module 5 according to a fifth embodiment, a first semiconductor device 10 and a second semiconductor device 20 are disposed side by side in an x-axis direction. The first semiconductor device 10 and the second semiconductor device 20 are disposed so that gate pads are in opposite directions in an orientation in which a longitudinal direction (or a long-side direction) and a y-axis direction coincide with each other. The second semiconductor device 20 is disposed in an orientation of being rotated by 180° about a vertical direction as an axis with respect to the first semiconductor device 10.

In the semiconductor module 5, a first conductive member 521 has the same shape as that of the first conductive member 121. The first conductive member 521 is joined to an upper surface of a source electrode of a first semiconductor device 10, and is joined to an upper surface of a joining plate (not shown) formed integrally with external terminals 502 to 504 at a connection portion. The drain electrode of the first semiconductor device 10 is joined to an upper surface of a joining plate (not shown) formed integrally with external terminals 505 to 508. An external terminal 501 and a gate electrode of the first semiconductor device 10 are electrically connected to each other through a gate connection member (not shown).

In the semiconductor module 5, a first conductive member 541 has the same shape as that of the first conductive member 121. The first conductive member 541 is joined to an upper surface of a source electrode of a second semiconductor device 20, and is joined to an upper surface of a joining plate (not shown) formed integrally with external terminals 512 to 514 at a connection portion. The drain electrode of the second semiconductor device 20 is joined to an upper surface of a joining plate (not shown) formed integrally with external terminals 515 to 518. An external terminal 511 and a gate electrode of the second semiconductor device 20 are electrically connected to each other through a gate connection member (not shown).

The external terminal 501 is a first gate terminal G1 electrically connected to the gate electrode of the first semiconductor device 10. The external terminal 511 is a second gate terminal G2 electrically connected to the gate electrode of the second semiconductor device 20. The external terminal 501, which is the first gate terminal G1, is disposed on the most negative side of the x-axis in the positive direction of the y-axis. The external terminal 511, which is the second gate terminal G2, is disposed on the most positive side of the x-axis in the negative direction of the y-axis. The first gate terminal G1 and the second gate terminal G2 are disposed at positions substantially point symmetrical with respect to a center when the resin mold 530 is viewed from the top.

The external terminals 502 to 504 are a first source terminal S1 electrically connected to the source electrode of the first semiconductor device 10. The external terminals 512 to 514 are a second source terminal S2 electrically connected to the source electrode of the second semiconductor device 20.

The external terminals 505 to 508 are a first drain terminal D1 electrically connected to the drain electrodes of the first semiconductor device 10. The external terminals 515 to 518 are a second drain terminal D2 electrically connected to the drain electrodes of the second semiconductor device 20.

The external terminal, which is adjacent to the external terminal 501, is only the external terminal 502. The external terminal 501 is the first gate terminal G1, and the external terminal 502 is the first source terminal S1. The external terminal 501 as the first gate terminal G1 is not adjacent to any of the external terminals 505 to 508 as the first drain terminal D1. The external terminal, which is adjacent to the external terminal 511, is only the external terminal 512. The external terminal 511 is the second gate terminal G2, and the external terminal 512 is the second source terminal S2. The external terminal 511 as the second gate terminal G2 is not adjacent to any of the external terminals 515 to 518 as the second drain terminal D2. In the semiconductor module 4, the gate terminal and the drain terminal electrically connected to the same semiconductor device are not adjacent to each other.

Even when the first semiconductor device 10 and the second semiconductor device 20 are not overlapped with each other and disposed side by side as in the semiconductor module 5, the first gate terminal G1 and the first drain terminal D1 are not adjacent to each other, and the second gate terminal G2 and the second drain terminal D2 are not adjacent to each other. As in the semiconductor module 4, the semiconductor module 5 may be applied to both the first inverter INV1 and the second inverter INV2 shown in FIG. 7 and the power supply relays RL1 and RL2 by adjusting the connections between the external terminals 502 to 508 and 512 to 518.

According to the embodiments described above, it is possible to attain the following effects.

The semiconductor modules 1 to 5 include the multiple semiconductor devices (for example, the first semiconductor device 10 and the second semiconductor device 20), the resin molds 130, 230, 330, 430, and 530 for integrally sealing the multiple semiconductor devices, and external terminals 101 to 104, 111 to 114, 201 to 204, 211 to 214, 301 to 304, 311 to 314, 401 to 404, 411 to 414, 501 to 504, and 511 to 514, which are disposed in a lateral side of the resin molds when a thickness direction of the semiconductor device is defined as the vertical direction.

The semiconductor devices 10, 11, 20, and 21 are vertical insulated gate semiconductor devices each including the gate electrode 75, the first electrode (for example, the source electrode 71), and the second electrode (for example, the drain electrode 72). In the semiconductor devices 10, 11, 20, and 21, a voltage is applied to the gate electrode so that a current flows from the first electrode to the second electrode of the semiconductor devices 10, 11, 20, and 21.

In the semiconductor modules 1 to 5, the gate terminal and the second terminal electrically connected to the same semiconductor device are not adjacent to each other. The first gate terminal G1 (corresponding to the external terminals 101, 201, 301, 401, and 501) electrically connected to the gate electrodes of the first semiconductor devices 10 and 11 and the first drain terminal D1 (corresponding to the external terminals 112 to 114, 212 to 214, 312 to 314, 405 to 408, and 505 to 508) corresponding to the second terminal electrically connected to the second electrodes of the first semiconductor devices 10 and 11 are not disposed at positions adjacent to each other. Even when two terminals of the external terminals, which are adjacent to each other, are short-circuited due to a contact, the gate electrodes and the second electrodes of the first semiconductor devices 10 and 11 may be inhibited from being short-circuited. The first semiconductor devices 10 and 11 may be inhibited from being subjected to thermal breakdown.

In the semiconductor devices 1 to 3, since the second drain terminal D2 corresponding to the second terminal electrically connected to the second electrodes of the second semiconductor devices 20 and 21 does not exist, the external terminal, which is adjacent to the second gate terminal G2 (corresponding to the external terminals 111, 211, and 311)

electrically connected to the gate electrodes of the second semiconductor devices 20 and 21, is not the second drain terminal D2.

In the semiconductor devices 4 and 5, the second gate terminal G2 (corresponding to the external terminals 411 and 511) electrically connected to the gate electrode of the second semiconductor device 20 and the second drain terminal D2 (corresponding to the external terminals 405 to 408 and 505 to 508) electrically connected to the second electrode of the second semiconductor device 20 are not disposed at positions adjacent to each other.

Even when two terminals of the external terminals, which are adjacent to each other, are short-circuited due to a contact, the gate electrodes and the second electrodes of the second semiconductor devices 20 and 21 may be inhibited from being short-circuited. Therefore, it is possible to inhibit the second semiconductor devices 20 and 21 from being subjected to thermal breakdown.

In order to realize the placement of the external terminals as described above, it may be preferable that the multiple semiconductor devices are vertical insulated gate semiconductor devices in which the first electrode is formed on the first surface side (upper surface 60u side) of the semiconductor substrate 60 and the second electrode is formed on the second surface side (lower surface 60b side) facing the first surface. It may be preferable that the second electrode of at least one of the multiple semiconductor devices is electrically connected to the electrode pads 122, 222, and 322 exposed to the lower surfaces of the resin molds 130, 230, 330, 430, and 530, and is not electrically connected to the external terminals.

As in the semiconductor modules 1 to 3, the multiple semiconductor devices may be stacked on each other in the vertical direction so that at least a part of the semiconductor devices overlaps with each other as viewed from the top. This placement may reduce the device area of the semiconductor modules 1 to 3.

Among the multiple semiconductor devices 10, 11, 20, and 21, the first electrodes of the second semiconductor devices 20 and 21 disposed below and the second electrode of the first semiconductor device 10 mounted adjacently above the second semiconductor devices 20 and 21 may be joined to each other through the third conductive members 124, 224, and 324. The third conductive members 124, 224, and 324 may be clips that are electrically connected to some of the external terminals. The clips may be suitably used for power semiconductor modules such as a power MOSFET in which a relatively large current flows.

The first gate terminal G1 may be disposed in a first direction (positive direction of y-axis) on the lateral side of the resin molds 130, 230, 330, 430, and 530, and the second gate terminal G2 may be disposed in a second direction (negative direction of y-axis) opposite to the first direction. The first gate terminal G1 and the second gate terminal G2 may also be disposed at positions substantially line symmetrical with respect to the line segments L1 and L3 substantially line orthogonal to the first direction and the second direction. Alternatively, the first gate terminal G1 and the second gate terminal G2 may be disposed at positions substantially point symmetrical with respect to a center when the resin mold is viewed from the top.

The multiple semiconductor devices may be semiconductor devices having the same size. Alternatively, the multiple semiconductor devices may include semiconductor devices having different sizes.

When the multiple semiconductor devices include the first semiconductor device 10 and the second semiconductor device 20 having the same shape, it may be preferable that the first semiconductor device 10 is disposed at an orientation of being rotated by substantially 90° around the vertical direction as an axis with respect to the second semiconductor device 20. In a situation where the first semiconductor device 10 and the second semiconductor device 20 are disposed in such a positional relationship, when the first semiconductor device 10 and the second semiconductor device 20 are mounted on each other so as to at least partially overlap with each other as viewed from the top, the connection between the gate terminal G1, G2 and the gate electrode of each of the semiconductor devices 10 and 20 are facilitated.

The semiconductor modules 1 to 5 may be applied to a drive circuit of the electric power steering system. More specifically, the semiconductor modules 1 to 5 may be applied to an inverter circuit included in the drive circuit. The semiconductor modules 4 and 5 may be applied to a power supply relay circuit as switching elements connected in series.

In the embodiments described above, a trench gate type MOSFET in which an n-channel is provided by application of a gate voltage is an example of a device structure of the semiconductor device. However, the semiconductor device structure is not limited to the above example. For example, the semiconductor element structure may be a planar gate type, a p-channel type in which p-type and n-type are substituted in FIG. 5, an insulated gate bipolar transistor (IGBT) or a reverse conduction IGBT (RC-IGBT). When the semiconductor device is an IGBT, the emitter electrode corresponds to a first electrode, and the collector electrode corresponds to a second electrode. An external terminal electrically connected to the emitter electrode corresponds to a first terminal, and an external terminal electrically connected to the collector electrode corresponds to a second terminal.

In FIG. 7, the switches SU1p to SW2n and SP1, SC1, SP2, SC2 are not limited to the MOSFET of the first semiconductor device 10 and the second semiconductor device 20, and a voltage-controlled semiconductor switching element such as an IGBT may be used. When an IGBT including no freewheeling diode is used as each of the switches SU1p to SW2n, it may be preferable to install a freewheeling diode for each of the switches SU1p to SW2n. For example, a freewheeling diode may be connected in anti-parallel to each of the switches SU1p to SW2n, or a reverse conduction IGBT (RC-IGBT) in which the freewheeling diode is formed in the same semiconductor substrate as the semiconductor substrate of IGBT or the like may be used as each of the switches SU1p to SW2n.

The shapes of the multiple semiconductor devices, the resin mold, the first joint member, and the like are not limited to the situation in which the shape is substantially rectangular when viewed from the top. The number of external terminals is not limited to the number described in each of the embodiments described above. For example, multiple gate terminals may be provided for each of the semiconductor devices. The drain terminal and the source terminal may have one or two terminals, or may have four or more terminals.

Although the semiconductor modules 1 to 5 have been described as examples in which two semiconductor devices are integrally modularized, the present disclosure is not limited to the above example, and a semiconductor module including three or more semiconductor devices may be used. For example, three internal configurations of the resin mold 130 shown in FIGS. 2 to 4 may be aligned in the x-axis direction and accommodated in one resin mold, and six semiconductor devices may be integrated into a module. When the six semiconductor devices are integrated into a module as described above, for example, a semiconductor module in which SU1, SV1, and SW1 shown in FIG. 7 is integrated together may be configured.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor module comprising:
a plurality of semiconductor devices;
a resin mold that integrally seals the semiconductor devices; and
a plurality of external terminals that are disposed at a lateral side of the resin mold in a case where a thickness direction of the semiconductor devices is defined as a vertical direction,
wherein each of the semiconductor devices includes an insulated gate semiconductor device having a gate electrode, a first electrode, and a second electrode,
wherein, in the insulated gate semiconductor device, carriers move from the first electrode to the second electrode through a channel provided by a voltage applied to the gate electrode,
wherein the plurality of external terminals include:
a gate terminal that is electrically connected to the gate electrode;
a first terminal that is electrically connected to the first electrode; and
a second terminal that is electrically connected to the second electrode, and
wherein the gate terminal and the second terminal, which are electrically connected to an identical semiconductor device among the semiconductor devices, are not adjacent to each other.

2. The semiconductor module according to claim 1, further comprising:
an electrode pad exposed to a lower surface of the resin mold,
wherein each of the semiconductor devices includes a vertical insulated gate semiconductor device that includes a semiconductor substrate having a first surface and a second surface facing each other,
wherein the first electrode is disposed at the first surface, and the second electrode is disposed at the second surface, and
wherein the second electrode of at least one of the semiconductor devices is electrically connected to the electrode pad, and is not electrically connected to the plurality of external terminals.

3. The semiconductor module according to claim 1,
wherein, in a top surface view of the semiconductor devices, the semiconductor devices are stacked on each other in the vertical direction to cause at least a part of the semiconductor devices to overlap with each other.

4. The semiconductor module according to claim 3,
wherein the semiconductor devices includes a first semiconductor device and a second semiconductor device, which is adjacently stacked on the first semiconductor device in the vertical direction, and
wherein the first electrode of the first semiconductor device and the second electrode of the second semiconductor device are joined to each other through a conductive member.

5. The semiconductor module according to claim 1,
wherein the semiconductor devices include a first semiconductor device and a second semiconductor device,
wherein the resin mold has a first lateral side facing a first direction and a second lateral side facing a second direction, which is opposite to the first direction,
wherein a part of the plurality of external terminals are disposed at the first lateral side, and another part of the plurality of external terminals are disposed at the second lateral side,
wherein the gate terminal includes a first gate terminal and a second gate terminal,
wherein the first gate terminal is connected to the gate electrode of the first semiconductor device, and is disposed at the first lateral side,
wherein the second gate terminal is connected to the gate electrode of the second semiconductor device, and is disposed at the second lateral side, and
wherein the first gate terminal and the second gate terminal are disposed at respective positions substantially line-symmetric with respect to a line segment substantially orthogonal to the first direction and the second direction.

6. The semiconductor module according to claim 1,
wherein the semiconductor devices include a first semiconductor device and a second semiconductor device,
wherein the resin mold has a first lateral side facing a first direction and a second lateral side facing a second direction, which is opposite to the first direction,
wherein a part of the plurality of external terminals are disposed at the first lateral side, and another part of the plurality of external terminals are disposed at the second lateral side,
wherein the gate terminal includes a first gate terminal and a second gate terminal,
wherein the first gate terminal is connected to the gate electrode of the first semiconductor device, and is disposed at the first lateral side,
wherein the second gate terminal is connected to the gate electrode of the second semiconductor device, and is disposed at the second lateral side, and
wherein, in a top surface view of the resin mold, the first gate terminal and the second gate terminal are disposed at respective positions substantially point-symmetric with respect to a center of the resin mold.

7. The semiconductor module according to claim 1
wherein the semiconductor devices include a first semiconductor device and a second semiconductor device,
wherein the first semiconductor device and the second semiconductor device are semiconductor devices having an identical shape,
wherein the first semiconductor device is disposed in an orientation rotated by substantially 90° around an axis with respect to the second semiconductor device, and
wherein the axis is along the vertical direction.

8. The semiconductor module according to claim 1,
wherein the semiconductor devices have an identical size.

9. The semiconductor module according to claim 1,
wherein the semiconductor devices include semiconductor devices having different sizes.

10. The semiconductor module according to claim 1,
wherein the semiconductor devices are applied to an inverter circuit.

11. The semiconductor module according to claim 1, wherein the semiconductor devices are applied to a power supply relay circuit.

12. The semiconductor module according to claim 1, wherein the semiconductor devices are applied to a drive circuit of an electric power steering system.

\* \* \* \* \*